United States Patent [19]
Lo

[11] Patent Number: 5,696,770
[45] Date of Patent: Dec. 9, 1997

[54] METHOD AND APPARATUS FOR TESTING CIRCUITRY WITH MEMORY AND WITH FORCING CIRCUITRY

[75] Inventor: Kwok Yin Lo, Dallas, Tex.

[73] Assignee: Texas Instruments Incorporated, Dallas, Tex.

[21] Appl. No.: 544,740

[22] Filed: Oct. 18, 1995

Related U.S. Application Data

[63] Continuation of Ser. No. 129,715, Sep. 30, 1993, abandoned.

[51] Int. Cl.$^6$ ................................................. G11C 29/00
[52] U.S. Cl. .................................................... 371/21.1
[58] Field of Search ............................. 371/21.1, 21.3, 371/22.3, 22.6, 27; 365/201; 395/183.18, 183.09; 324/73.1; 364/578, 488, 489, 490

[56] References Cited

U.S. PATENT DOCUMENTS

| | | | |
|---|---|---|---|
| 4,063,080 | 12/1977 | Eichelberger | 235/302 |
| 4,195,770 | 4/1980 | Benton et al. | 371/21 |
| 4,481,627 | 11/1984 | Beauchesne et al. | 371/21 |
| 4,862,460 | 8/1989 | Yamaguchi | 371/27 |
| 5,285,453 | 2/1994 | Gruodis | 371/27 |
| 5,377,122 | 12/1994 | Werner et al. | 364/488 |
| 5,392,277 | 2/1995 | Hiserote | 364/578 |

Primary Examiner—Robert W. Beausoliel, Jr.
Assistant Examiner—Stephen C. Elmore
Attorney, Agent, or Firm—W. Daniel Swayze, Jr.; W. James Brady, III; Richard L. Donaldson

[57] ABSTRACT

A method and apparatus for testing circuits with memories is provided in which a memory array (26) is coupled to memory input logic (33) and memory output logic (34). Furthermore, forcing circuitry (36) is coupled in parallel with memory (26). An automatic test pattern generator transmits test patterns to memory input logic (33) to test its functionality. During testing operations, a memory array (26) is tri-stated. Tri-stating is accomplished by programming the automatic test pattern generator with a model of a tri-stating circuit (38) rather than actual memory array (26). Memory output logic (34) is tested by forcing its inputs through forcing circuitry (36). Forcing circuitry (36) forces the inputs to memory output logic (34) either by receiving a pattern from the automatic test pattern generator or by generating signals based on the outputs from memory input logic (33).

4 Claims, 4 Drawing Sheets

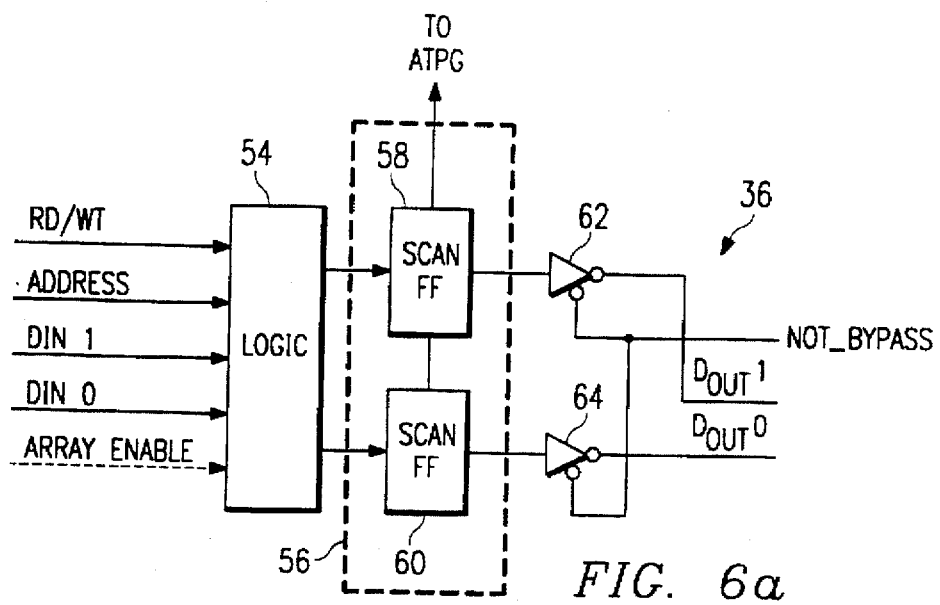
FIG. 6a
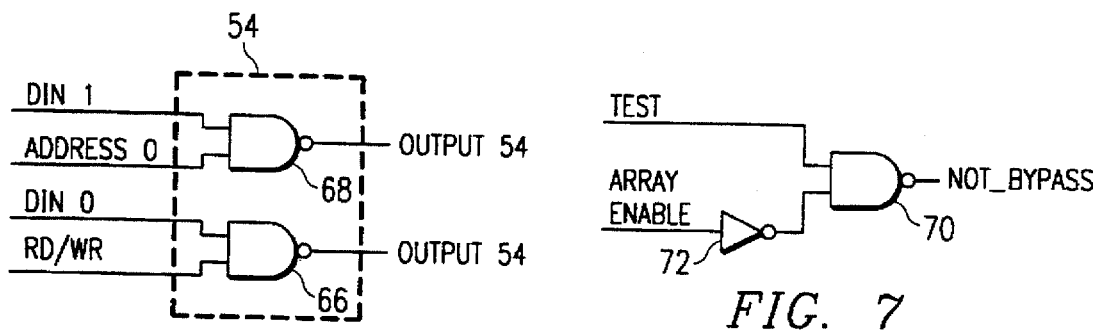
FIG. 6b
FIG. 7
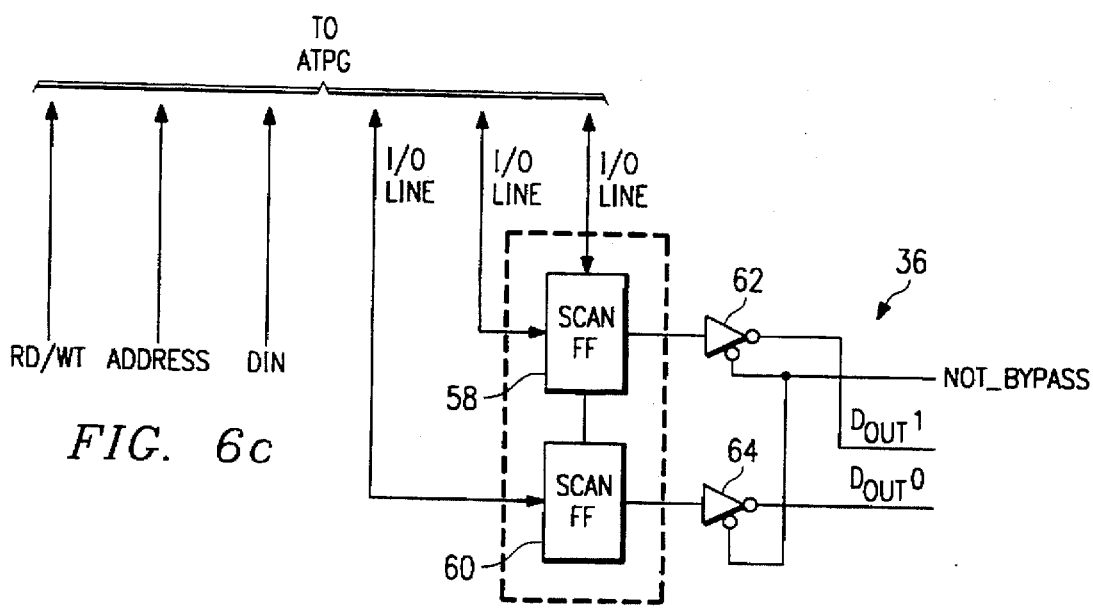
FIG. 6c

METHOD AND APPARATUS FOR TESTING CIRCUITRY WITH MEMORY AND WITH FORCING CIRCUITRY

This application is a Continuation of application Ser. No. 08/129,715, filed Sep. 30, 1993, now abandoned.

TECHNICAL FIELD OF THE INVENTION

This invention relates generally to electronic circuits, and more particularly to a method and apparatus for testing circuitry with memory.

BACKGROUND OF THE INVENTION

Various systems for testing the functionality and interconnection of integrated circuits and circuit boards have been developed. These testing systems provide several functions, including ensuring proper interconnection between circuit components and the proper operation of each circuit component. Such testing helps to isolate faults, improve system reliability, and reduce maintenance costs, among other things.

Various protocols and systems have been developed to provide these testing functions. For testing the internal operation of a circuit component, such as an integrated circuit chip, such systems should have the ability to force and monitor internal points on the component. Typically, this occurs by writing to and reading the states of a particular point or points within a device under test. These states can be written to and read from, for example, scan flip-flops integrated into the component.

To determine whether the device under test is operating properly, the testing system must know what the correct state is at the point or points it is monitoring. Thus, the testing system must know the inputs that drive the state, as well as the circuit components within the device under test.

One way of determining these inputs is to have the test system generate them. With this technique, the test system knows the inputs and the circuitry under test, and is therefore able to determine what the proper state should be at the point being monitored. Often, it is appropriate to monitor several points within a device under test, and to force inputs or states at more than one place within a device under test. A system that has the ability to generate certain inputs, or patterns, to a device under test is referred to as an automatic test pattern generator ("ATPG").

A persistent problem arises with the above described test systems when they test circuits that include memories, such as random access memories or read-only memories. Examples of chips that may include such memories are application specific integrated circuits ("ASIC"), microcontrollers, and microprocessors, among other circuits. This problem arises because it is desirable to test the functionality of both the logic that is used to access and generate addresses for the memory on the chip, as well as the logic circuitry that makes use of the data stored in the memory array. However, the outputs of the memories cannot be forced to a particular state without significant effort, thus limiting the ability to test the logic circuitry fed by the memory.

For example, if the address generating and decoding circuitry of a circuit including a ROM is tested, the result is that a particular address is generated. Then, the contents of that addressed memory location will be output. Thus, the circuitry that is fed by that ROM array will be tested only by the pattern that is stored within that particular addressed ROM. It is desirable, however, to test that "output" circuitry with patterns other than just that stored within the particular addressed ROM. A similar problem exists with circuits including RAM arrays.

SUMMARY OF THE INVENTION

Therefore, a need has arisen for a testing system and architecture that will allow testing of circuits that include memory arrays. In accordance with the present invention, a method and apparatus for testing circuitry with memory is provided which substantially eliminates or reduces disadvantages and problems with prior art testing systems.

In particular, a method and system are provided for testing a circuit that includes a memory array. A model of the circuit to be tested is programmed into a test pattern generator. The part of the model that corresponds to the memory array is a tri-state circuitry representation that results in tri-stating of the memory array during test operations. A test pattern is generated at the automatic test pattern generator and input to the circuit under test, and forcing circuitry forces the states of the outputs of the memory array. At least one point in the circuit under test is then monitored to test its functionality.

In a particular embodiment, the automatic test pattern generator is informed that an array enable signal is coupled to the tri-state circuitry representation, such that the automatic test pattern generator causes the array enable signal to be active, thereby tri-stating the memory array.

In another particular embodiment, a circuit under test includes a memory input logic and a memory output logic. Memory input logic is tested by receiving a test pattern from the automatic test pattern generator. The memory output logic is tested by forcing states of the outputs of the memory array. Forcing is accomplished either by receiving a memory output logic test pattern from the automatic test pattern generator or by generating the forcing pattern from the outputs of the memory input logic.

An important technical advantage of the present invention is the fact that functionality of circuits with memories can be tested with a wide variety of testing patterns. This technical advantage is accomplished by using an automatic test pattern generator to tri-state the outputs of the memory array and then force them to any desired state through forcing circuitry.

BRIEF DESCRIPTION OF THE DRAWINGS

For a more complete understanding of the present invention, and the advantages thereof, reference is now made to the following description taken in conjunction with the accompanying drawings, in which:

FIGS. 6a–6c illustrate block diagrams of forcing circuitry according to the teachings of the present invention; and FIG. 7 illustrates a circuit schematic for generating a not-bypass signal according to the teachings of the present invention.

DETAILED DESCRIPTION OF THE INVENTION

Figure 1:
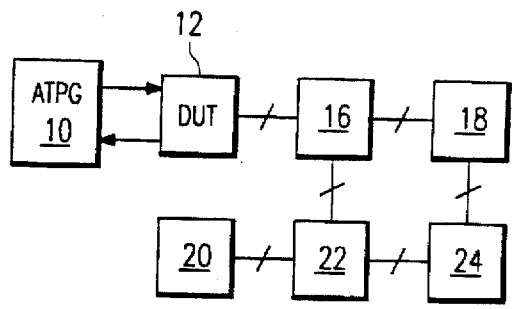
FIG. 1 illustrates a block diagram of a testing system and device under test according to the teachings of the present invention.

FIG. 1 illustrates an automatic test pattern generator ("ATPG") 10 coupled to a device under test ("DUT") 12. DUT 12 may be an integrated circuit, and may be independently tested or tested as part of a circuit board 14, and may be coupled to other components, such as components 16–24. ATPG 10 is operable to test each of the devices on circuit board 14 as well as their functionality together. It should be understood that the present invention operates both to test a single component independently of other components, as well as the operability of several components connected together.

ATPG 10 transmits data to DUT 12, and receives data from DUT 12. ATPG 10 may send and receive this data serially, over single lines, or send and receive it in parallel over several lines. In operation, ATPG 10 is programmed with information on the particular circuitry to be tested in DUT 12. Patterns (or inputs) are generated by ATPG 10 and output to DUT 12. ATPG 10 then monitors the states of various points within the circuitry of DUT 12 to determine if it is functioning properly.

Figure 2:
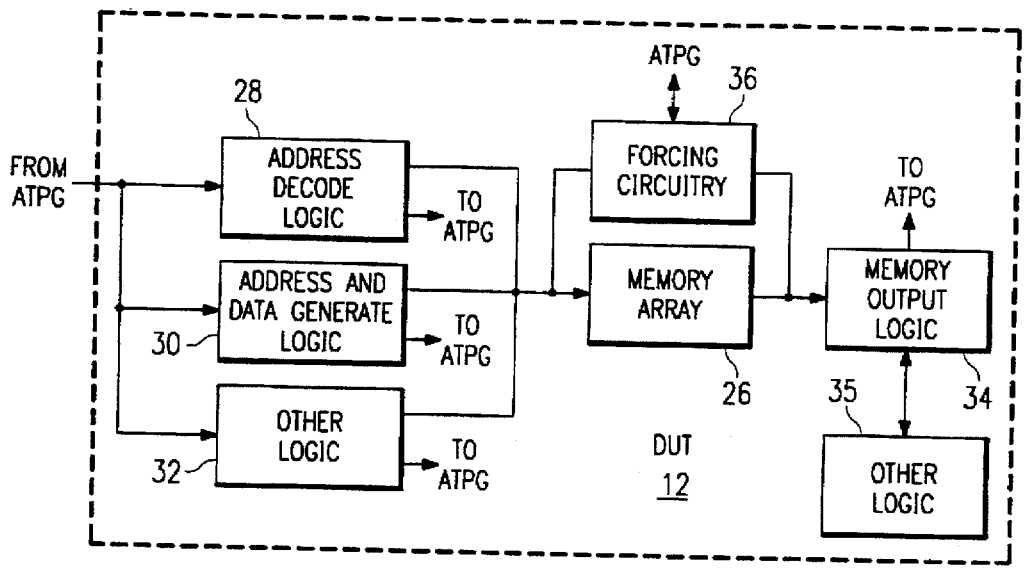
FIG. 2 illustrates a block diagram of a device under test according to the teachings of the present invention.

FIG. 2 illustrates a block diagram of the circuitry of DUT 12. The present invention discloses methods and circuitry for testing devices that include memory arrays. Thus, as shown in FIG. 2, a memory array 26 is surrounded by various circuits within DUT 12. Various logic circuits, such as address decode logic 28, address and data generate logic 30, and other random logic 32 are coupled to memory array 26. These circuitries may perform various functions, including random logic functions and addressing of memory array 26 for reading or writing operations, and are exemplary only. Logic circuits 28, 30, and 32 are collectively referred to as memory input logic, and connect to memory array 26. Memory output logic 34 is also coupled to memory array 26 and other random logic 35, and may perform various logic functions. For example, memory output logic 34 may read a particular addressed memory location and, in connection with other logic 35, perform some logic function for output or further internal processing. The combination of memory output logic 34 on other logic 35 will be referred to simply as memory output logic, for clarity.

ATPG 10 generates test patterns to test these various circuitries. As shown in FIG. 2, ATPG 10 may input patterns to logic circuits 28, 30, and 32. Furthermore, the outputs of these various logic circuits can be read by ATPG 10 to ensure their proper operation. As is generally known, ATPG 10 may generate serial test patterns. Once these test patterns are loaded, the circuit is operated under some normal condition and the resultant state is read out for comparison with an expected result. ATPG 10 reads these states at particular points being monitored through scan flip-flops. These scan flip-flops are often connected in a serial chain for serial loading and unloading of test data.

DUT 12 also includes forcing circuitry 36. Forcing circuitry 36 is included in parallel with memory array 26, and allows ATPG 10 to input various patterns memory output logic 34 to test memory output logic 34's functionality. By placing forcing circuitry 36 in parallel with memory array 26, memory array 26, as will be discussed, will be taken off-line during testing, thereby eliminating the problems discussed above in connection with prior art testing systems. ATPG 10 can generate inputs to memory output logic 34 by either writing patterns directly to forcing circuitry 36 or by controlling the inputs to forcing circuitry 36 received from memory input logic 28, 30, and 32.

Figure 3:
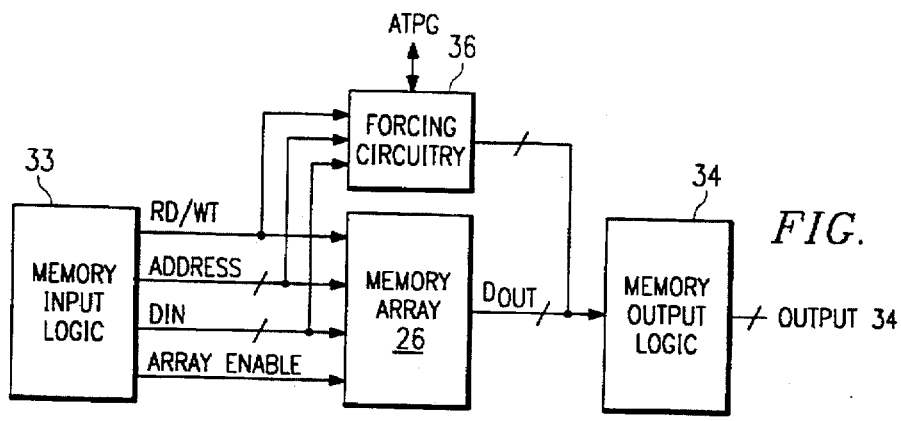
FIG. 3 illustrates a block diagram of a memory array and forcing circuitry of a device under test according to the teachings of the present invention.

FIG. 3 illustrates the inputs to memory array 26. These signals include, among other possible signals, a read-write signal, address signals, data in signals, and an array enable signal. These signals are typically generated either by the memory input logic 33 or directly from off-chip sources. Thus, they can be generated, in a test mode, either directly by ATPG 10 or by the logic circuits 28, 30, and 32. These signals may also be input to forcing circuitry 36, as will be discussed below. These signals, as is generally known, are the basic signals used to access the memory array 26. Thus, the memory array is enabled, written to, and addressed over the array enable, data in, and address lines, respectively. Data is read out over the data output lines. This output data is fed to the memory output logic 34.

As discussed above, during test operations, forcing circuitry 36 will force the states of the output lines of memory array 26, which are input into memory output logic 34. This is accomplished because the outputs from memory array 26 are tri-stated during testing functions, thus ensuring that forcing circuitry 36 has control of the signals lines output from memory array 26. Tri-stating of memory array 26 occurs while the array enable signal is active. Similarly, the outputs of memory array 26 may be tri-stated during write operations. Thus, tri-stating can be accomplished through the array enable signal, the write signal, or any combination of the two.

As discussed previously, the particular circuitry within the device under test is programmed into ATPG 10. Thus, representations of the actual circuitry are programmed into ATPG 10. This programming is necessary so that ATPG 10 can determine the appropriate states at points being monitored based on inputs and patterns it generates.

Instead of informing ATPG 10 that memory 26 is included in DUT 12, however, a model that is different than the actual memory array 26 is programmed into ATPG 10. The model that is input is a model that causes the ATPG 10 to tri-state the outputs from memory array 26, thereby allowing forcing circuitry 36 to drive the memory array 26 outputs.

Figure 4:
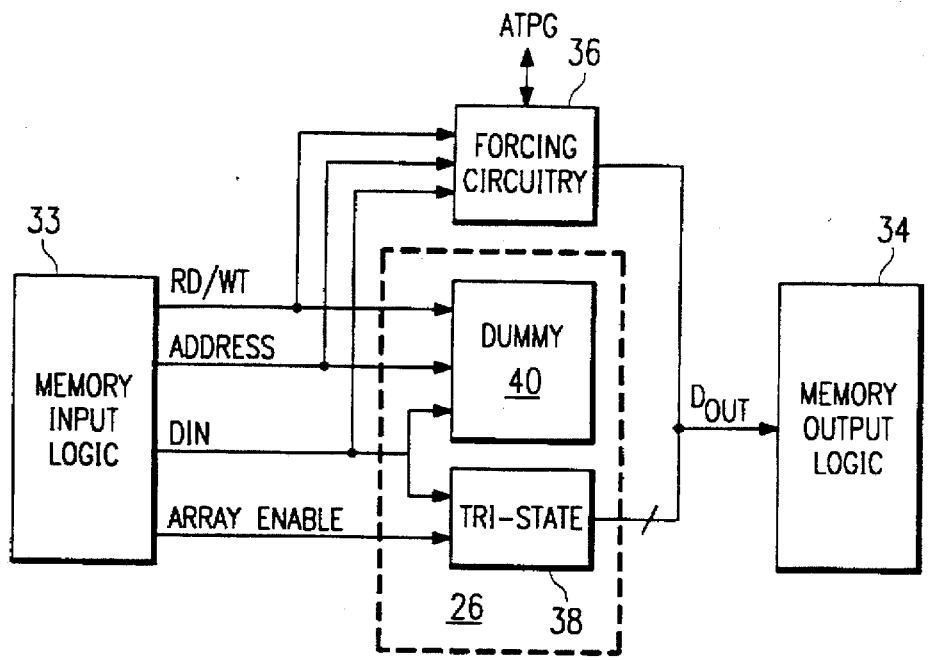
FIG. 4 illustrates a block diagram of a model fed to a test system according to the teachings of the present invention.

A particular model that can be used in place of the actual memory circuitry 26 is shown in FIG. 4. The data in ($D_{in}$) and array enable signals are shown as coupled to tri-state circuitry 38. The read-write signal and the address lines are coupled to dummy circuit 40. Likewise, the $D_{in}$ signals can be input to dummy circuit 40 and the address signals can be coupled to the tri-state circuitry 38. Dummy circuit 40 is simply a dead-end, as it has no outputs. The ATPG 10 is programmed such that during the test mode, it will always force the output of tri-state circuitry 38 to the tri-state condition. This can be accomplished by having ATPG 10 always assert the array enable signal.

To place tri-state circuitry 38 in its tri-state condition, ATPG 10 controls the signals (in particular the array enable signal) that it believes are coupled to tri-state circuitry 38. By controlling these actual signals, the outputs of memory array 26 ($D_{out}$) are actually tri-stated.

Figure 5:
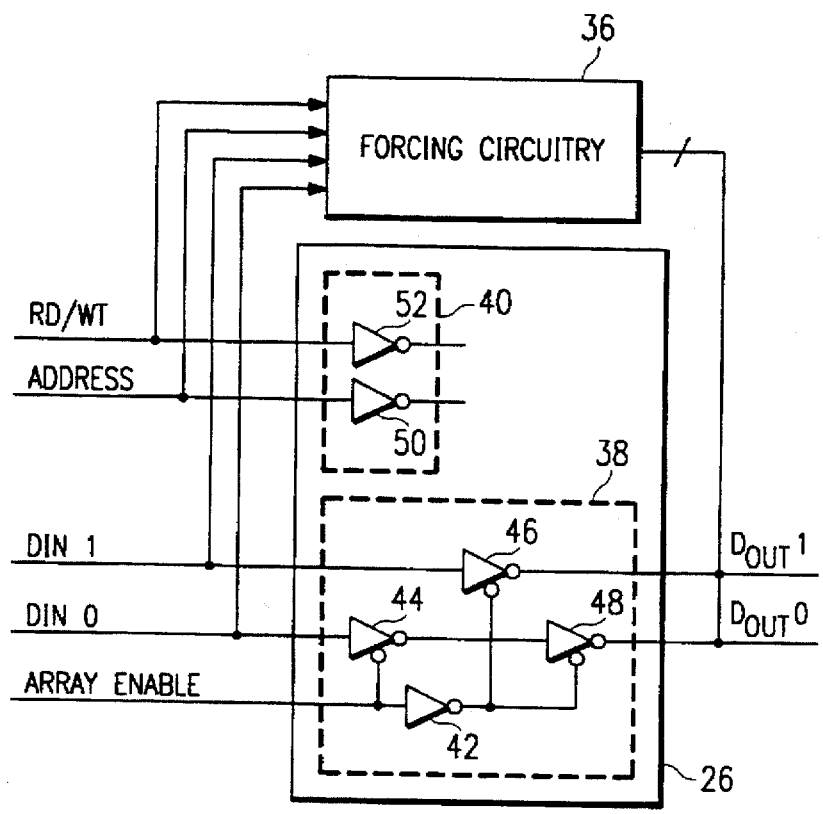
FIG. 5 illustrates a more detailed diagram of a model input to a test system according to the teachings of the present invention.

FIG. 5 illustrates a particular embodiment of the model that is input to ATPG 10 in place of the actual circuitry of memory array 26. As shown in FIG. 5, tri-state circuitry 38 includes inverters 42, 44, 46, and 48. Inverters 44, 46, and 48 are three-state inverters. Inverters are chosen for a particular embodiment, it being understood that other tristatable devices, such as three state drivers, may also be used.

ATPG 10 is informed that the array enable signal is input to inverter 42. The array enable signal is also input to the enable input of inverter 44. The output of inverter 42 is input to the enable inputs of inverters 46 and 48. The output of inverter 44 is coupled to the input of inverter 48. The inputs of inverters 44 and 46 are coupled to $D_{in}$ 0 and $D_{in}$ 1. It should be understood that the present invention operates with one-bit or N-bit memories. Thus, the model tri-state circuitry 38 is exemplary only. With more data input lines than shown in FIG. 5, more inverters will be used.

A single three-state inverter, such as inverter 46, is programmed into ATPG 10 for each $D_{in}$ line. $D_{in}$ line 0 is shown with two three-state inverters to ensure that ATPG 10 asserts the array enable signal. With the inverters 42, 44, and 48 coupled as shown in FIG. 5, ATPG 10 will automatically assert the array enable (as shown here, negative logic) to prevent the line between inverters 44 and 48 from floating at an indeterminent state. It should be understood that a single inverter could be used for each $D_{in}$ line if ATPG 10 is programmed to always assert the array enable signal. With the two inverter embodiment for the $D_{in}$ 0 line, the ATPG 10 will automatically assert the array enable signal.

Thus, with the inverters coupled as shown in FIG. 5, the outputs of inverters 46 and 48 will be tri-stated, and ATPG 10 will believe that the $D_{out}$ 0 and $D_{out}$ 1 lines will be driven solely by forcing circuitry 36. This will be the actual case as well, as asserting array enable results in tri-stating of memory array 36. The address lines and the read-write lines are shown as being input to inverters 50 and 52, with one inverter for each address line. These inverters are dummy inverters, and are not coupled to any other circuitry. This corresponds to the actual functionality when array enable is asserted, since the $D_{out}$ lines will be tri-stated from the memory array 26 and therefore able to be driven by forcing logic 36.

FIG. 6a illustrates a particular embodiment of forcing circuitry 36 according to the teachings of the present invention. The signals that are input to memory array 26, such as read-write, the address lines, and the data input lines, are input to logic 54. The array enable signal may also be input to logic 54 as well. Outputs from logic 54 are coupled to a register 56. Register 56 includes scan flip-flops, one for each output of logic 54. In a particular embodiment, logic 54 has two outputs, as will be discussed in connection with FIG. 6b, and thus, register 56 has two scan flip-flops 58 and 60. Scan flip-flops 58 and 60 are coupled to three-state inverters 62 and 64. The outputs of inverters 62 and 64 are coupled to the data output lines of the memory array 26.

The three-state inverters 62 and 64 are enabled by a not_bypass signal. During a test mode, the not_bypass signal will be asserted and inverters 62 and 64 will be active. During a non-test condition the not_bypass signal will not be active, and inverters 62 and 64 will be tri-stated. Thus, in the non-test situation, the outputs of the memory array 26 will not be driven by forcing circuitry 36. The register 56 may be coupled to ATPG 10 so as to allow ATPG 10 to monitor the output of this register, and therefore the preceding logic circuitry. Likewise, ATPG 10 can be coupled to each of the signals input to logic 54, through latches, so as to monitor their states.

FIG. 6b illustrates a particular embodiment for logic 54. The particular embodiment of FIG. 6b corresponds to the example with two data input lines, one address line, and a read-write signal. Each of these input signals is input to NAND gates. In particular, $D_{in}$ 0 and read-write are input to NAND gate 66. The $D_{in}$ 1 signal and the address 0 signal are input to NAND gate 68. Depending on the number of data input lines, address lines, and other memory control signals the amount of logic within logic 54 will change. The purpose of logic 54 is to generate a total of n outputs from all of the various inputs to it. This number n is equal to the number of data output lines of the memory array. Thus, logic 54 may be a multiplexer or any other kind of logic that can perform this function. Whatever logic circuitry is chosen for logic 54, ATPG 10 will be informed of this actual circuitry. Thus, ATPG 10 will drive the appropriate address, data, and other memory control signals so as to force the appropriate output from logic 54 that will be passed through register 56 and out to the $D_{out}$ lines for testing of memory output logic 34. FIG. 6c illustrates an alternative embodiment for forcing circuitry 36 in which logic 54 is deleted. Thus, ATPG 10 may be coupled, through data latches, to the read-write, data, and address lines that are input the memory array 26. This will allow ATPG 10 to monitor the circuitry that generates these signals. To test the memory output logic 34, forcing circuitry 36 will still have to force the states of the data output lines. With the embodiment of FIG. 6c, ATPG 10 is coupled to the inputs of register 56, either serially or in parallel. Thus, the scan flip-flops of register 56 will be directly loaded with forcing signals by ATPG 10. In this way, ATPG 10 can directly force the state of the data output lines with a memory output logic 34 test pattern.

FIG. 7 illustrates a circuit for generating the not_bypass signal. The not_bypass signal is generated by inputting a test mode signal and the array enable signal into a NAND gate 70. The output of NAND gate 70 is the not_bypass signal. The array enable signal, as it is active low in this embodiment, is passed through an inverter 72 before being input to NAND gate 70.

Figure 8:
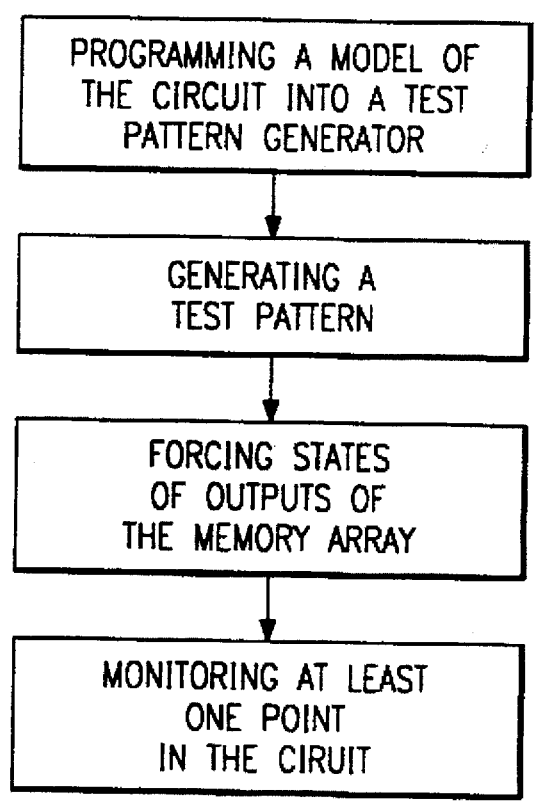
FIG. 8 illustrates method steps of the present invention.

FIG. 8 illustrates method steps of the present invention of programming a model of the circuit into a test pattern generator, generating a test pattern, forcing states of outputs of the memory array, and monitoring at least one point in the circuit.

Although the present invention and its advantages have been described in detail, it should be understood that various changes, substitutions and alterations can be made herein without departing from the spirit and scope of the invention as defined by the appended claims.

What is claimed is:

1. A method of testing a circuit that includes a memory array, memory input logic, and memory output logic, comprising the steps of:

programming a model of the circuit into a test pattern generator, a portion of the model corresponding to the memory array being a tri-state circuitry representation that results in tri-stating of the memory array during test operations;

tri-stating said memory array during said test operations;

generating a test pattern at the test pattern generator to test the memory input logic and the memory output logic;

forcing states of outputs of the memory array from forcing circuitry in response to the test pattern generator; and monitoring the circuit to test the functionality of the memory input logic and the memory output logic, wherein said step of programming comprises informing the test pattern generator that the tri-state circuitry representation includes tri-statable circuit devices coupled between data input and data output lines of the memory array.

2. A system for testing a circuit that includes the memory array, comprising:

a test pattern generator that includes a model of the circuit, a part of the model corresponding to the memory array being a tri-state circuitry representation that results in tri-stating of the memory array during test operations;

memory input logic operable to receive a test pattern from the test pattern generator;

forcing circuitry operable to force states of outputs of the memory array in response to said test generator; and monitoring circuitry operable to allow monitoring of at least one point in the circuit to test a functionality of the circuit, wherein the memory array includes data input lines and data output lines, and wherein the tri-state circuitry representation includes tri-statable circuit devices coupled between the data input and data output lines.

3. The system of claim 2, wherein the tri-statable circuit devices comprise tri-statable inverters.

4. The system of claim 2, wherein the tri-statable circuit devices comprise tri-statable drivers.

* * * * *